United States Patent
Zhang et al.

(10) Patent No.: US 7,163,721 B2
(45) Date of Patent: Jan. 16, 2007

(54) METHOD TO PLASMA DEPOSIT ON ORGANIC POLYMER DIELECTRIC FILM

(75) Inventors: Zhihong Zhang, Fremont, CA (US); Tai Dung Nguyen, Fremont, CA (US); Tue Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 325 days.

(21) Appl. No.: 10/360,134

(22) Filed: Feb. 4, 2003

(65) Prior Publication Data

US 2004/0151844 A1    Aug. 5, 2004

(51) Int. Cl.
*H05H 1/24*      (2006.01)
*C23C 16/06*    (2006.01)
*C23C 16/40*    (2006.01)
*C23C 16/50*    (2006.01)
*C23C 16/52*    (2006.01)

(52) U.S. Cl. ............... 427/569; 427/576; 427/579; 438/789; 438/763

(58) Field of Classification Search ............... 427/562, 427/563, 564, 569, 576, 578, 579, 255.36, 427/255.37, 255.31, 255.391, 255.392, 255.393, 427/255.394; 438/763, 764, 771, 776, 787, 438/788, 789, 790, 791, 792, 793, 794
See application file for complete search history.

(56) References Cited

U.S. PATENT DOCUMENTS

| | | | | |
|---|---|---|---|---|
| 5,480,818 | A * | 1/1996 | Matsumoto et al. | 438/150 |
| 5,576,071 | A * | 11/1996 | Sandhu | 427/534 |
| 6,200,651 | B1 * | 3/2001 | Roche et al. | 427/571 |
| 6,277,756 | B1 * | 8/2001 | Ohara et al. | 438/700 |
| 6,281,147 | B1 * | 8/2001 | Yamazaki et al. | 438/788 |
| 6,319,822 | B1 * | 11/2001 | Chen et al. | 438/637 |
| 6,326,307 | B1 * | 12/2001 | Lindley et al. | 438/689 |
| 6,436,819 | B1 * | 8/2002 | Zhang et al. | 438/656 |
| 6,720,268 | B1 * | 4/2004 | Laermer et al. | 438/700 |
| 6,730,614 | B1 * | 5/2004 | Lim et al. | 438/763 |
| 6,756,318 | B1 | 6/2004 | Nguyen et al. | 438/758 |

(Continued)

OTHER PUBLICATIONS

International Search Report mailed Feb. 3, 2005.

*Primary Examiner*—Marianne Padgett
(74) *Attorney, Agent, or Firm*—Fliesler Meyer LLP

(57) ABSTRACT

A method for protecting an organic polymer underlayer during a plasma assisted process of depositing a subsequent film on the organic polymer underlayer is disclosed. The method provides the deposition of a protective continuous layer using organic polymer damage-free technique in order to not damage the organic polymer underlayer and to protect the organic polymer underlayer during the plasma assisted process of depositing a subsequent film. The organic polymer damage-free technique is a non-plasma process, using only thermal energy and chemical reactions to deposit the continuous layer. The organic polymer damage-free technique can also be a plasma assisted process using a reduced plasma power low enough in order to not damage the organic polymer underlayer. This method is applicable to many organic polymer underlayers such as organic polymer is aromatic hydrocarbon, polytetrafluoroehtylene (PTFE), parylene, benzocyclobutene-based polymers (BCB), polyimide, fluorinated polyimide, fluorocarbon-based polymers, poly(arylene ether)-based polymers (PAE), cyclohexanone-based polymers, and to many plasma assisted deposition processes such as plasma enhanced CVD deposition, plasma enhanced ALD deposition and plasma enhanced NLD deposition of silicon dioxide, silicon nitride, nitrided diffusion barrier such as TiN, TaN, WN, TiSiN, TaSiN, WSiN.

17 Claims, 7 Drawing Sheets

U.S. PATENT DOCUMENTS

| | | | |
|---|---|---|---|
| 6,998,275 B1* | 2/2006 | Zhao et al. | 438/3 |
| 2002/0000667 A1* | 1/2002 | Ahn et al. | 257/758 |
| 2002/0155639 A1* | 10/2002 | Ohtake et al. | 438/118 |
| 2003/0059538 A1* | 3/2003 | Chung et al. | 427/304 |
| 2005/0199586 A1* | 9/2005 | Matsushita et al. | 216/67 |

* cited by examiner

METHOD TO PLASMA DEPOSIT ON ORGANIC POLYMER DIELECTRIC FILM

FIELD OF THE INVENTION

This invention relates generally to integrated circuit processes and fabrication, and more particularly, to a method to deposit an impermeable film on low-k dielectric films.

BACKGROUND OF THE INVENTION

The demand for progressively smaller, less expensive, and more powerful electronic products creates the need for smaller geometry integrated circuits (ICs), and larger substrates. It also creates a demand for a denser packaging of circuits onto IC substrates. The desire for smaller geometry IC circuits requires that the dimension of interconnections between the components and the dielectric layers be as small as possible. Therefore, recent research continues to focus on the use of low resistance materials (e.g., copper) in conjunction of with insulating materials with low dielectric constant (k) between the metal lines.

The use of low resistance materials is needed because of the reduction of the cross section area of via interconnects and connecting lines. The conductivity of interconnects is reduced as the surface area of interconnects is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics.

There is a need for interconnects and vias to have low resistivity, and the ability to withstand volatile process environments. Aluminum and tungsten metals are often used in the production of integrated circuits for making interconnections or vias between electrically active areas. These metals have been used for a long time in the production environment because the processing technologies for these metals were available. Experience and expertise on these metals have also been acquired in the process due to the long-term usage.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

However, there have been problems associated with the use of copper in IC processing. Copper poisons the active area of silicon devices, creating unpredictable responses. Copper also diffuses easily through many materials used in IC processes and, therefore, care must be taken to keep copper from migrating.

Various means have been suggested to deal with the problem of copper diffusion into integrated circuit materials. Several materials, including metals and metal alloys, have been suggested for use as barriers to prevent the copper diffusion process. The typical conductive diffusion barrier materials are TiN, TaN and WN. Addition of silicon into these materials, TiSiN, TaSiN, WSiN, could offer improvement in the diffusion barrier property. For non-conductive diffusion barrier, silicon nitride has been the best material so far.

Diffusion barrier materials could be deposited by the chemical vapor deposition technique. For example, in the case of TiN CVD deposition, a precursor that contains Ti and optionally nitrogen, is used. The precursor decomposes to form a TiN layer on selected surfaces. Precursor by-products (products formed as the precursor decomposes that do not participate in the reactions) and reaction by-products (products formed from the reaction that are not deposited on the selected surfaces) are often volatile and being exhausted away.

Equally importance with the use of low resistance materials in interconnecting lines is the introduction of low dielectric constant materials (low-k dielectrics) for insulating between the interconnecting lines. The use of copper as a conductor and low-k dielectric as the dielectric material can provide lower delay time for advanced ICs. Low-k dielectrics are insulating dielectric materials that exhibit dielectric constants less than conventional IC dielectric materials such as silicon dioxide (k value of about 4), silicon nitride (k value of about 7), or silicon oxy-nitride (k value of about between 4 and 7).

Various low-k dielectrics have been introduced such as fluorine doped silicon dioxide (k value of about 3–3.6), carbon doped silicon dioxide (dielectric constant of about 2.5–3.3), fluorinated carbon (k value of about 2.5–3.6), and organic materials such as parylene (k value of about 3.8–3.6), polyimide (k value of about 3–3.7). Some of these materials have been successfully incorporated into the IC fabrication processes, but some materials have not because of various difficulties involved with the integration. The low-k dielectrics can be deposited by CVD or spin-on techniques.

Further research is focusing on porous low-k dielectrics because of the potential lower dielectric constant (2–3). The examples of porous low dielectric materials are porous hydrosilsesquioxane or porous methyl silsesquioxane, porous silica structures such as aerogel, low temperature deposited silicon carbon films, low temperature deposited Si—O—C films, methyl doped porous silica.

The porous low-k dielectrics present a significant integration problem such as low mechanical strength, poor dimensional stability, poor temperature stability, high moisture absorption, permeation, poor adhesion, large thermal expansion coefficient, and unstable stress level.

Currently, the most successful low-k dielectric films are polymer-based dielectrics. The polymer-based dielectrics can be inorganic polymers such as silicon-based polymers like SOG (spin-on glass). The polymer-based dielectrics can be organic polymers such as silicon-based polymers with higher organic contents, an aromatic hydrocarbon, poly (arylene ether) (PAE) films, benzocyclobutene (BCB) based films, polyimides or fluorinated polyimides, amorphous fluorinated carbon films, polytetrafluoroethylene (PTFE) films, or parylene.

Various companies have introduced a variety of organic polymer dielectric films. Schumacher offers VELOX, a non-fluorinated PAE material. Allied Signal's FLARE 2.0 product is also a PAE material. Dow Chemical's SiLK material is another aromatic polymer, an aromatic hydrocarbon containing no silicon or fluorine. Dow Chemical also offers Cyclotene BCB products as low dielectric material.

Among the problems associated with organic polymer low dielectric materials, the problem of plasma damage is very severe. Generally, plasma-excited etchants such as fluorine, chlorine, bromine, oxygen, or even nitrogen can etch many materials, though oxygen or nitrogen plasma have little effect on inorganic materials. However, plasma excited oxygen or nitrogen has a strong etching effect on organic polymer materials. Plasma oxygen is routinely used to strip photoresist, an organic polymer material.

The principle of CVD (chemical vapor deposition) or CVD related technique is the chemical reactions of appropriate precursors (special chemicals) in vapor phase. Taking the deposition of NLD titanium nitride (TiN) thin films as an example, the precursor, tetrakis(dimethylamino) titanium (TDMAT), vapor is introduced into the reactor, and then thermally decomposed into titanium nitride and other by-products on the surface of a substrate to form a raw TiN film which contaminated with carbon and hydrogen, the raw TiN film is further treated by nitrogen plasma to remove any contaminates. Therefore, CVD related deposition process techniques need thermal energy, or plasma energy, or both.

The processes that use the plasma energy are called plasma assisted processes (or plasma enhanced processes). The advantages of a plasma assisted process are a wider selection of precursors and the lower of substrate temperature can be used. The disadvantages of a plasma assisted process are the presence of highly energetic species due to plasma excitation which can cause damage of the substrates if not well-controlled. Plasma excited species can definitely damage organic polymer films. Such damages bring issues especially in the recent introduction of organic polymer low dielectric film as insulator for metal interconnects.

A typical plasma assisted process, called PECVD (plasma enhanced chemical vapor deposition), is a CVD process that employs plasma energy during the deposition period, and therefore cause the undesirable effect of etching the organic polymer underlayer before the formation of the deposited film. Another plasma assisted process, call PEALD (plasma enhanced atomic layer deposition), is an ALD process that employs plasma energy. In an ALD process, the precursors are sequentially introduced to the process chamber. The first precursor molecules are adsorbed on the substrate to form a saturated monolayer, and then the second precursor molecules are introduced and to react with the adsorbed first precursor molecules to form a monolayer of the target material. PEALD employs plasma energy during the introduction of the first precursors, or during the introduction of the second precursors, or during the introduction of both precursors. In all cases, the organic polymer underlayer is either totally or partially exposed to the plasma species and therefore causes the undesirable effect of etching the organic polymer underlayer before the formation of the deposited film.

Another plasma assisted process, called PENLD (plasma enhanced nanolayer deposition), is an NLD process that employs plasma energy. The NLD and PENLD processes are of the same authors and are disclosed in a co-pending application Ser. No. 09/954,244, filing date Sep. 10, 2001, inventors Tue Nguyen and Tai Dung Nguyen, now U.S. Pat. No. 6,756,318. The NLD process is a hybrid of the CVD and ALD processes. In NLD process, the precursors are introduced sequentially, similar to ALD process. But then the first precursors are deposited on the substrate to form a thin film with a thickness ranging from 0.5 to 5 nanometers, similar to CVD process. The second precursors are introduced after the removal of the first precursors to react with the deposited thin film. PENLD employs plasma energy in the deposition of the first precursors, or in the reaction of the second precursors or both. PENLD could cause damage to the organic polymer underlayer if the organic polymer under-layer is exposed to the plasma excited species during the process.

SUMMARY OF THE INVENTION

Accordingly, a method to protect an organic polymer dielectric underlayer during a plasma assisted process is provided. The disclosed method basically is to ensure that the organic polymer dielectric underlayer will not be exposed to reactive chemicals or a plasma ambient containing plasma excited species with high enough power, which can cause damage to the organic polymer dielectric underlayer during the plasma-assisted deposition of a subsequent film such as a conductive diffusion barrier (TiN, TiSiN, TaN, TaSiN, $WN_x$, WSiN) or a dielectric diffusion barrier (SiC, $Si_3N_4$). To protect the organic polymer under-layer, a continuous protective layer must be formed on the organic polymer under-layer before exposing the organic polymer under-layer to reactive chemicals or plasma excited species.

In a first preferred embodiment, the method to protect the organic polymer dielectric underlayer comprises 2 steps:
  depositing a non-organic layer using thermal assisted process. This non-organic layer functions as a protective layer to protect the organic polymer dielectric underlayer during subsequent steps
  depositing a plasma assisted film onto the non-organic protective layer.

The non-organic protective layer is preferably continuous and densified in order to best protect the organic polymer dielectric under-layer. The protective layer also needs to be of materials not damageable by plasma excited species or reactive chemicals.

Typical organic polymer dielectric under-layers used in semiconductor processing are aromatic hydrocarbon (SiLK or FLARE), polytetrafluoroehtylene (PTFE), parylene, benzocyclobutene-based polymers (BCB), polyimide, fluorinated polyimide, fluorocarbon-based polymers, poly (arylene ether)-based polymers (PAE), cyclohexanone-based polymers. This list is a representative and not serves as a complete list. Any organic polymer under-layer that can be damaged by plasma excited species or reactive chemicals, such as nitrogen, oxygen, hydrogen, fluorine, or chlorine, can be applied in the present invention.

Typical non-organic polymer materials used in semiconductor processing are inorganic polymers, organic polymers containing a high level of inorganic polymer, inorganic materials such as silicon-based materials, metal based materials such as copper, TiN, TaN, WN, TiSiN, TaSiN, WSiN, $SiO_2$, $Si_3N_4$, metal films, Si film. Again, this list is a representative and not serves as a complete list. Any materials that cannot be damaged by plasma excited species or reactive chemicals can be applied in the present invention.

The minimum thickness of the protective layer is one monolayer in order to be continuous. The protective layer could be as thick as a few nanomaters. Since the main purpose of the protective layer is to protect the organic polymer under-layer, thinner protective layer is desirable to avoid any effect on the properties of low-k dielectrics. The protective layer can be deposited using thermal CVD (non PECVD process), or many cycles of the thermal ALD process (non PEALD process) until the formation of a continuous layer, or thermal NLD process (non PENLD process) of more than one cycle, or the first thermal deposition of a PENLD process, provided that the thickness of the first thermal deposition is equal or more than a monolayer and continuous.

Specific process is the uses of Ti-containing precursors, either inorganic precursors or metal organic precursors, such as TDMAT, TDEAT, TEMAT, $TiCl_4$ precursors and other carrier gas or other gaseous precursors such as $NH_3$, $N_2$, silane to form a thermal assisted TiN or TiSiN films, or the uses of Ta-containing precursors to form TaN or TaSiN films, or the uses of W-containing precursors to form $WN_x$ or WSiN films.

Also the protective layer can be deposited using TEOS precursors with optional gaseous precursors such as oxygen, ozone to form a silicon dioxide film, or using silicon-containing precursors such as silane precursors with optional gaseous precursors such as nitrogen, ammonia to form a silicon nitride film, or using silicon-containing precursors such as silane precursors with optional gaseous precursors such as nitrogen, hydrogen to form a silicon film, or using silicon-containing precursors such as silane or carbon-containing precursors such as methane precursors to form a silicon carbide or silicon oxycarbon film.

After the deposition of the continuous protecting layer, the plasma assisted process can be used to deposit the desired film. The plasma assisted processes can be PECVD, PEALD, or PENLD.

Any of the plasma assisted processes can be used. Specifically, a PENLD process using thermal decomposed TDMAT with plasma assisted nitrogen is very successful in depositing a thin TiN layer. With the addition of silicon-containing precursors such as silane, thin film of TiSiN can be form. Other films such as TaN, TaSiN, WN, WSiN, silicon dioxide, silicon nitride, amorphous silicon, polysilicon, silicon oxycarbon, silicon carbide can be formed.

A typical plasma assisted process has power of between 600 W to 3000 W. Any power can be used, but lower power is not very effective, and higher power can cause damage.

The deposition of the protective layer and the plasma assisted layer may or may not be of the same precursors. A combination of silicon dioxide continuous film and a TiN diffusion barrier plasma assisted film are from different precursors, while a combination of TiN diffusion barrier thermal continuous film and a TiN diffusion barrier plasma assisted film are from the same precursors with the variation only in plasma power.

An optimized PENLD process can perform both continuous and plasma assisted layer without many changes. A typical PENLD process deposits about 10–20 angstrom thermal layer, and then uses plasma species such as nitrogen or hydrogen to densify the deposited layer. In a typical PENLD process, the nucleation time varied depending on the substrates, therefore the first few layers might not received 10–20 angstrom thickness. In that case, a typical PENLD process might not be adequate to process an organic polymer film. An optimized PENLD process is a typical PENLD process that has been optimized so that the first deposition layer thickness is more than a monolayer and that the first deposition layer is continuous. Such optimized PENLD process will protect the organic polymer underlayer without sacrificing the quality of the plasma assisted film.

In a second preferred embodiment, the method to protect the organic polymer dielectric underlayer comprises 2 steps:
  depositing a non-organic protective layer using low plasma power plasma assisted process in order to avoid damaging the organic polymer dielectric underlayer and to function as a protective layer during subsequent steps
  depositing a high power plasma assisted film onto the protective layer.

Different organic polymer has different tolerant toward the plasma excited species. The amount of low plasma power depends on a particular organic polymer. Typically, the low plasma power is between 100 W to about 500 W.

The high plasma power is between 600 W to about 3000 W, similar to the first preferred embodiment.

DETAILED DESCRIPTION OF THE PREFERRED EMBODIMENT

Figure 1:
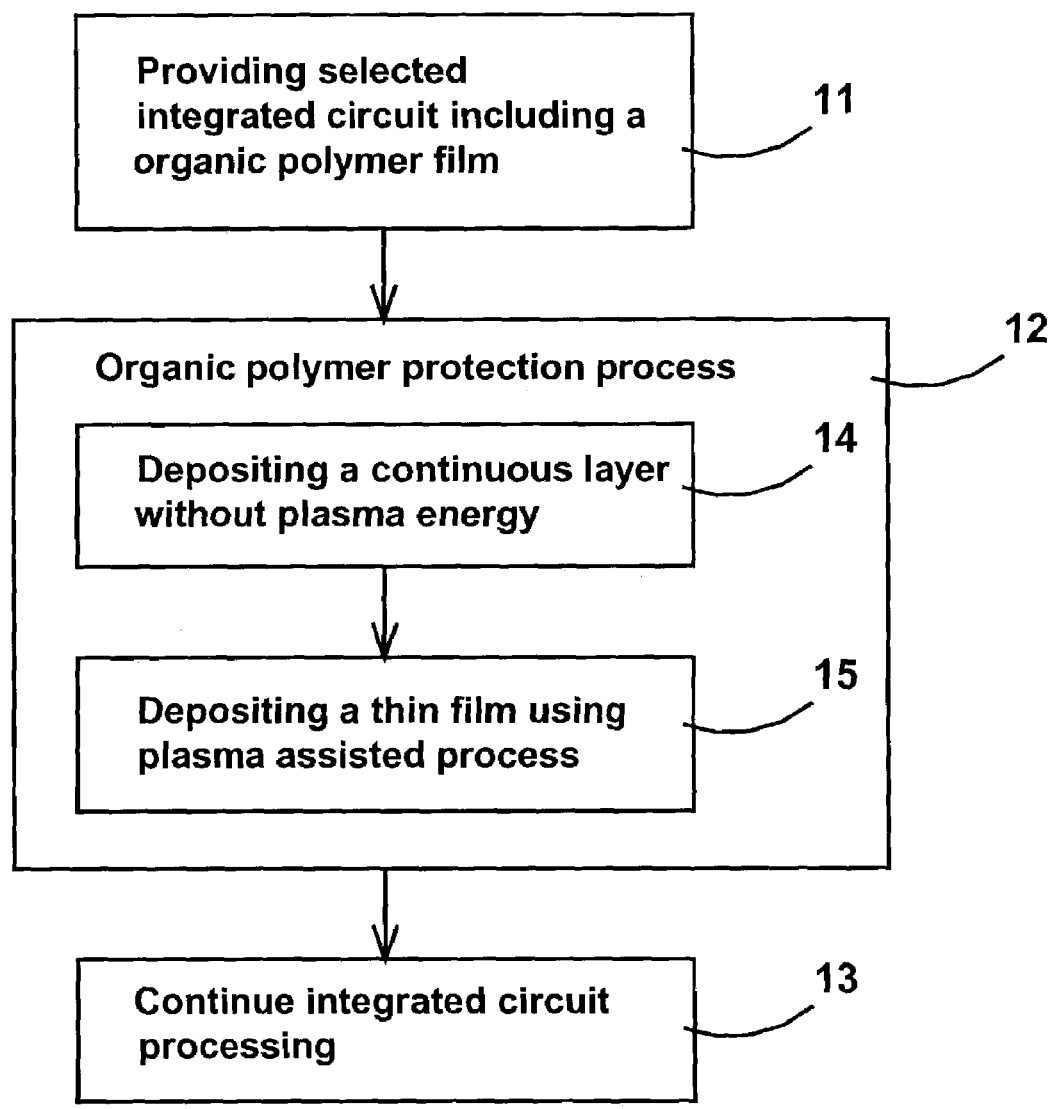
FIG. 1 is a flowchart showing the steps in the first embodiment of the method to protect the organic polymer dielectric underlayer.

FIG. 1 is a flowchart showing the steps in the first embodiment of the method to protect the organic polymer dielectric underlayer. Step 11 provides the selected integrated circuit including an organic polymer dielectric film. Step 12 shows the current invention organic polymer protection process comprising 2 steps: step 14 and step 15. Step 14 provides the deposition of a continuous film using non plasma process in order to not damage the organic polymer dielectric film and to protect the organic polymer dielectric film during the plasma exposure of the next step. Then step 15 provides the plasma assisted deposition of a thin film on top of the continuous film. Step 13 provides the rest of the integrated circuit processing such as interconnect and passivation. To not exposing the organic polymer dielectric film to an ambient containing energetic plasma excited species, step 14 provides a protection layer. The deposition step 14 and the deposition step 15 can be processed in the same process chamber, or in a cluster system. A cluster system can have 4 to 6 process chambers connected to a transfer chamber with a robotic system capable of transferring the wafers from one process chamber to another process chamber. The process chambers and the transfer chamber are typically under vacuum with a pressure of milliTorr or microTorr. The chambers in the cluster system are well maintained to ensure minimum amount of moisture and other organic molecules.

Figure 2:
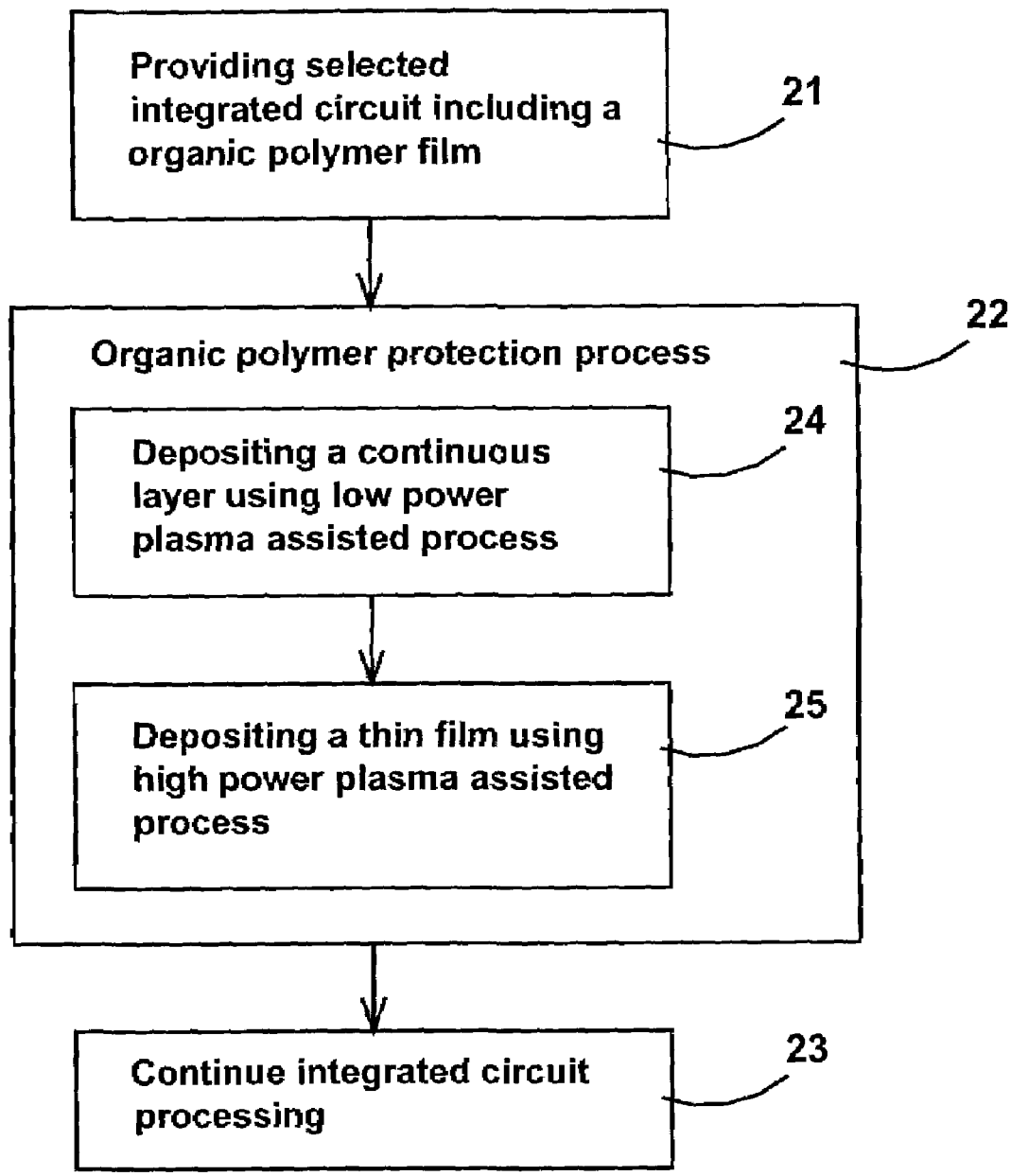
FIG. 2 is a flowchart showing the steps in the second embodiment of the method to protect the organic polymer dielectric underlayer.

FIG. 2 is a flowchart showing the steps in the second embodiment of the method to protect the organic polymer dielectric underlayer. Step 21 provides the selected integrated circuit. Step 22 shows the current invention organic polymer protection process comprising 2 steps: step 24, 26 and step 25. Step 24 provides the deposition of a continuous film using low power plasma process in order to not damage the organic polymer dielectric film and to protect the organic polymer dielectric film during the plasma exposure of the next step. Then step 25 provides a high power plasma assisted deposition of a thin film on top of the continuous film. Step 23 provides the rest of the integrated circuit processing such as interconnect and passivation. Typically, the deposition of the continuous film and the deposition of the impermeable film are occurred in the same process chamber if the materials in these 2 films are similar, such as TiN with different levels of plasma energies. The depositions can occur in 2 separate processing chamber connected to a cluster system if the materials in these 2 films are dissimilar, such as silicon dioxide for a continuous film and TiN for a plasma assisted film.

FIG. 3 shows the schematic of a typical integrated processing incorporating the present invention. FIG. 3a shows a typical interconnect underlayer. The underlayer comprises a bottom dielectric layer 40 with a bottom conducting line 42 and a top dielectric layer 44. The bottom conducting layer 42 is covered by a diffusion barrier layer 41. Layer 43 is a top diffusion barrier for the bottom conducting layer 42 and also served as an etch stop layer. Layer 45 is optional and served as a cap layer or a passivation layer for the dielectric layer 44. The dielectric layer 40 and 44 can be porous low-k dielectric films or organic polymer or inorganic polymer dielectric films to reduce the propagation delay.

Figure 3A:
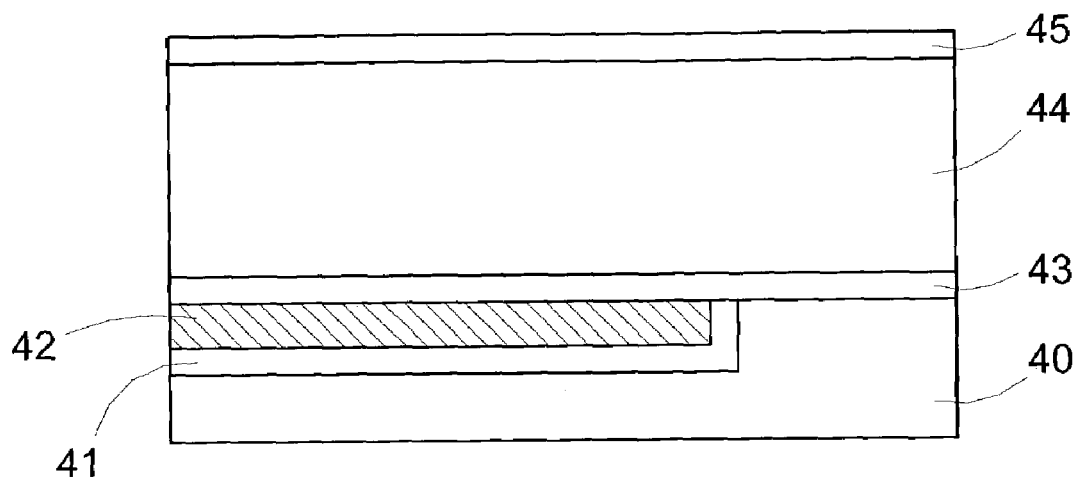
FIG. 3 shows the schematic of a typical integrated processing.
Figure 3B:
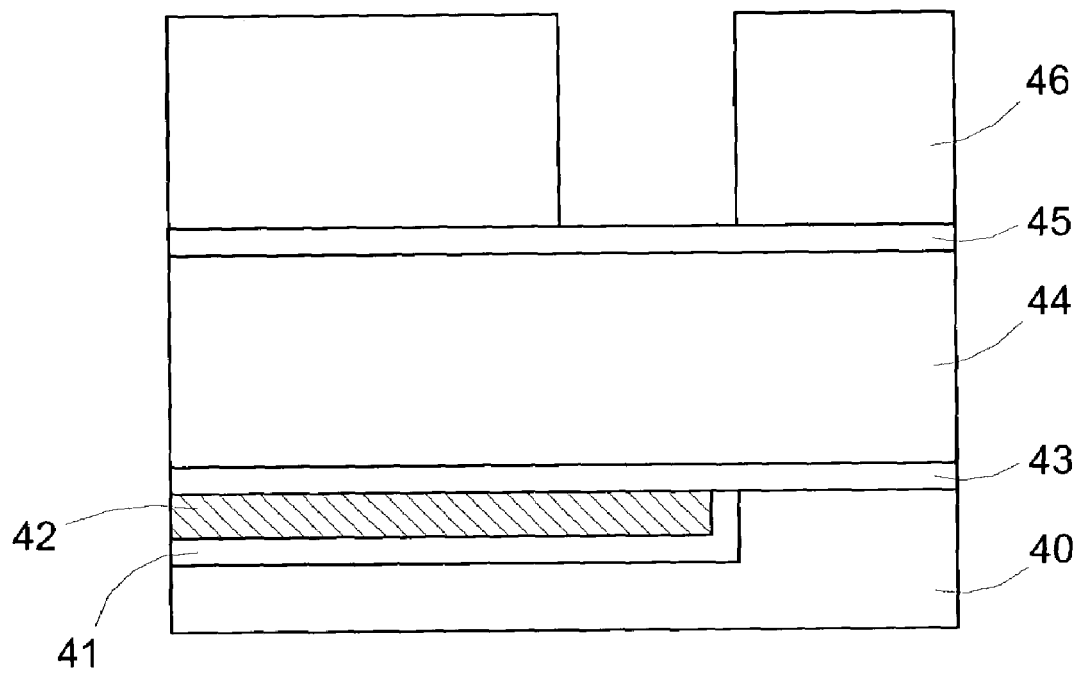

FIG. 3b shows the patterning step of the dielectric film 44. A photoresist film 46 is coated on the cap layer 45 (or on the dielectric film 45 if there is no cap layer 46). The photoresist is then exposed with a pattern mask and then the exposed photoresist is developed and removed. The photoresist now contains the pattern from the mask.

Figure 3C:
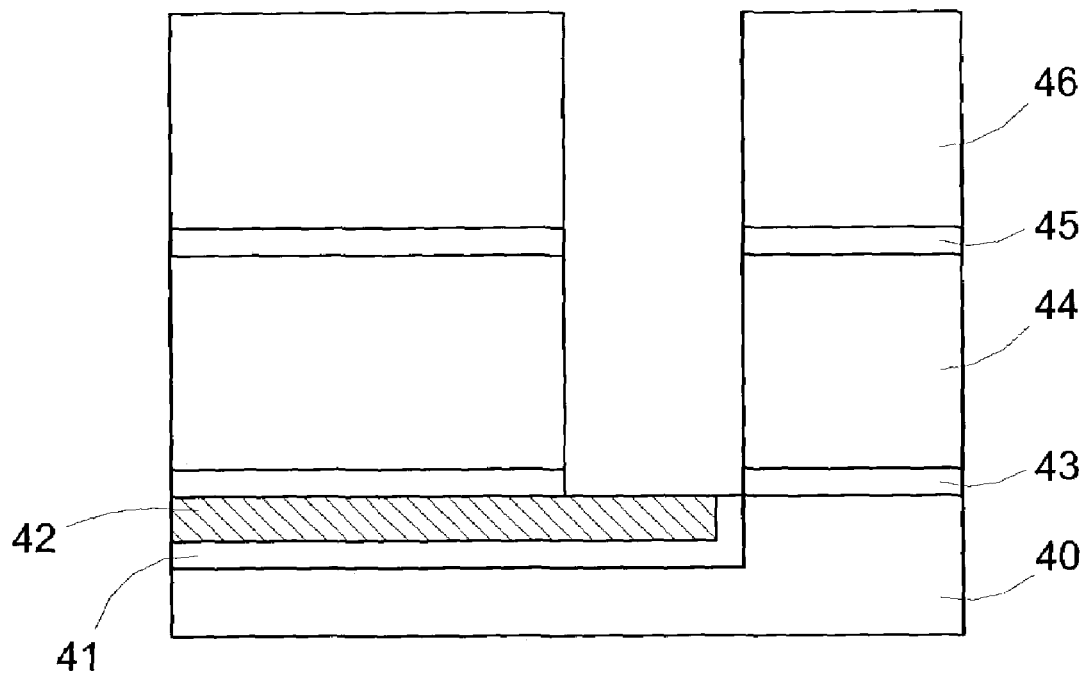

FIG. 3c shows the transfer of the photoresist pattern onto the dielectric film by a plasma etch process. The photoresist protects the underlayer and the etch process only etch the exposed area as shown in FIG. 3c.

Figure 3D:
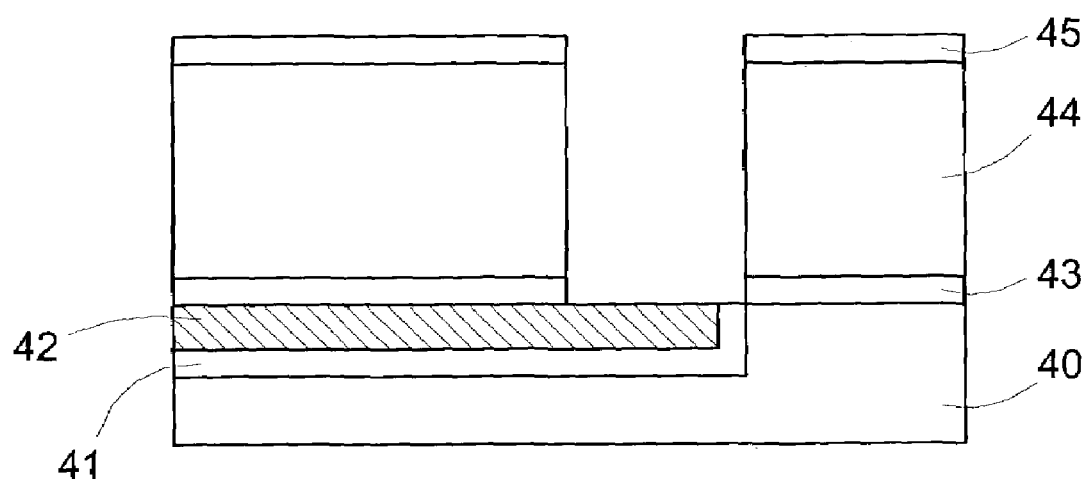

FIG. 3d shows the next step of removing the residue photoresist and cleaning of the dielectric film 44.

Figure 3E:
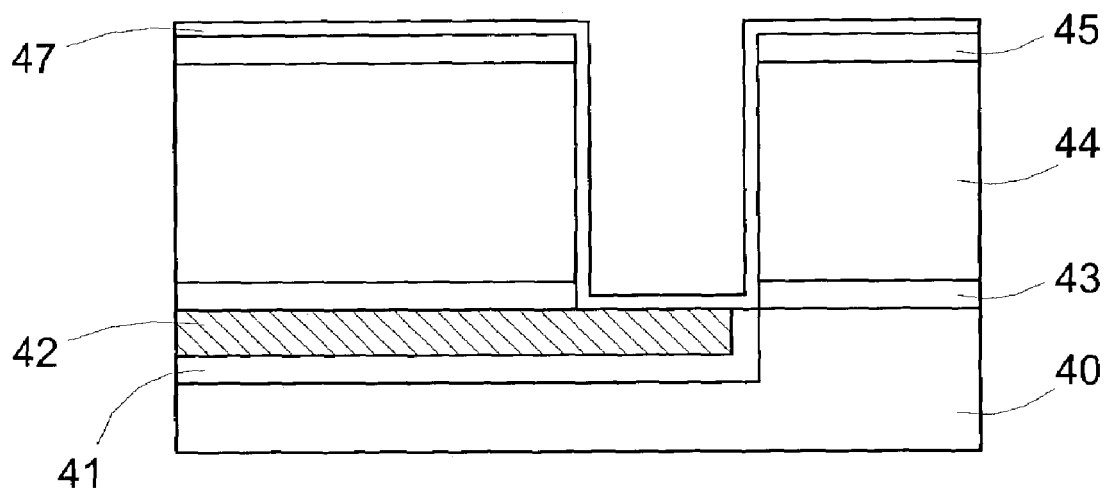
Figure 3F:
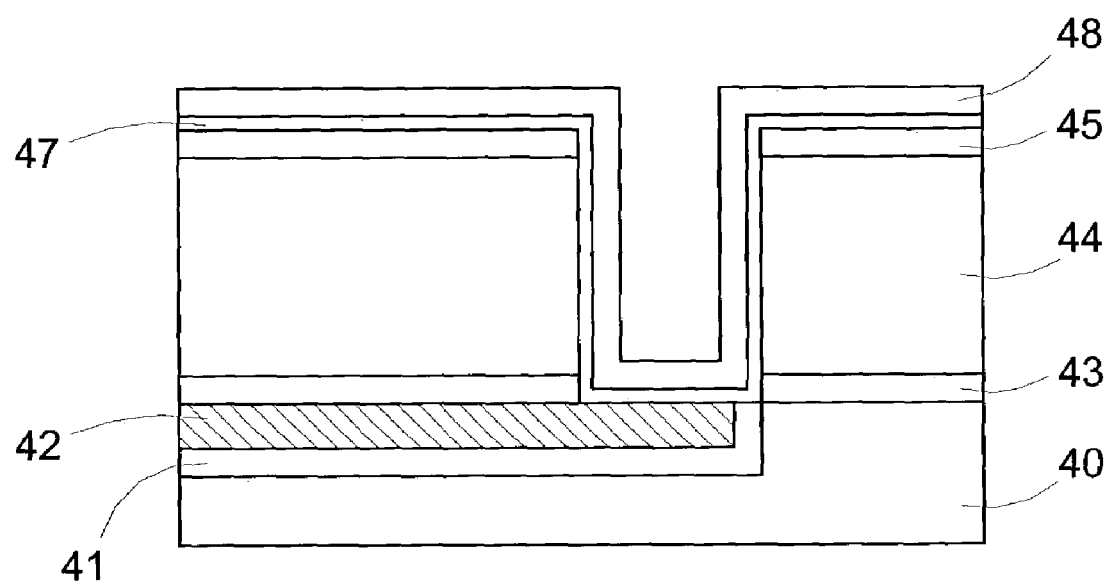
Figure 3G:
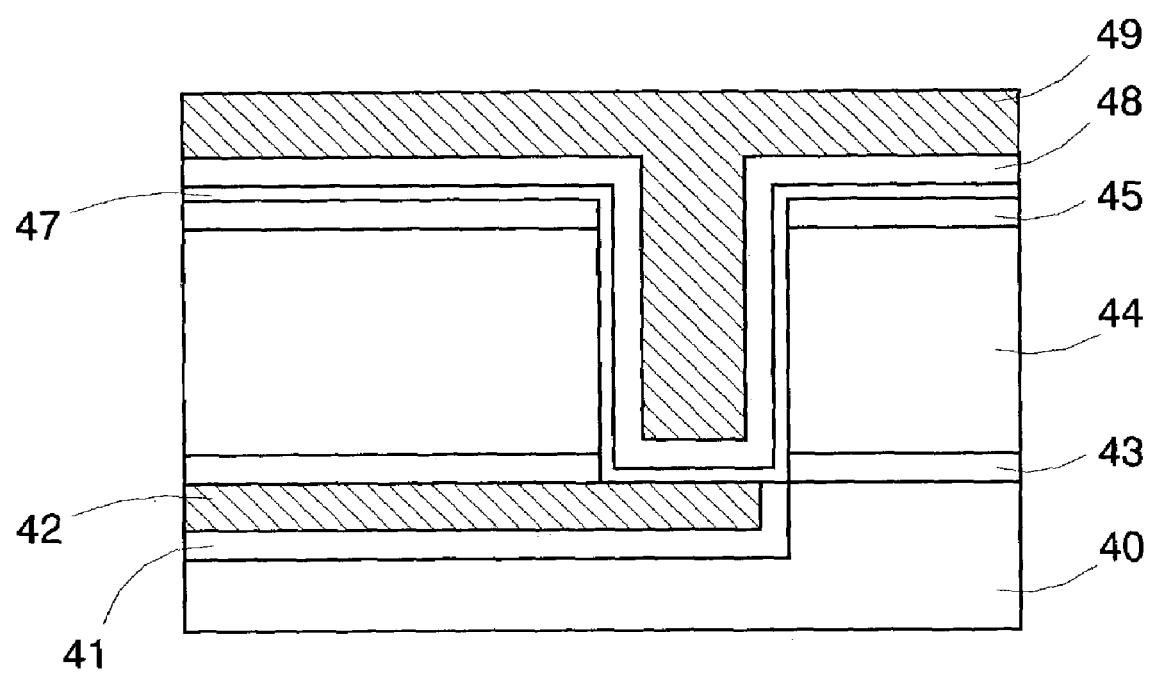

FIG. 3e shows the step of depositing a continuous film 47 to not damage the organic polymer dielectric film 44 and to protect the organic polymer 44 against later plasma assisted deposition step. FIG. 3f shows the step of depositing a plasma assisted film 48 such as a diffusion barrier. And FIG. 3g shows the step of depositing the metal conduction line 49. Typical diffusion barriers for semiconductor interconnect are TiN, TiSiN, TaN, TaSiN, WN, WSiN, using for copper interconnect and aluminum interconnect.

FIG. 4 shows the SEM images of the samples with and without protective layer.

Figure 4A:
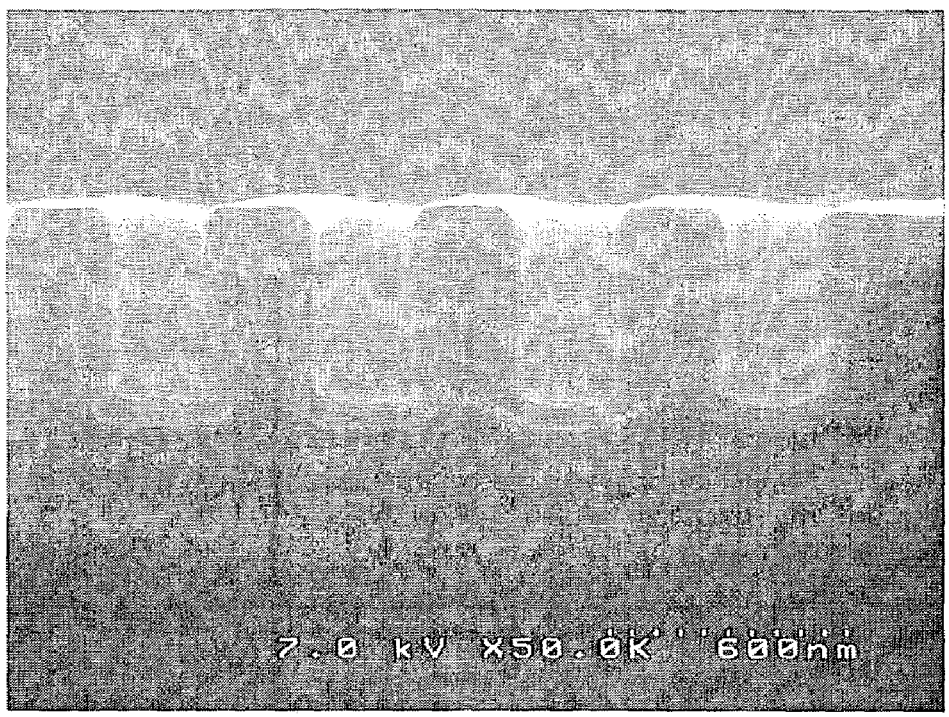
FIG. 4 shows the SEM images of the samples with and without protective layer.
Figure 4B:
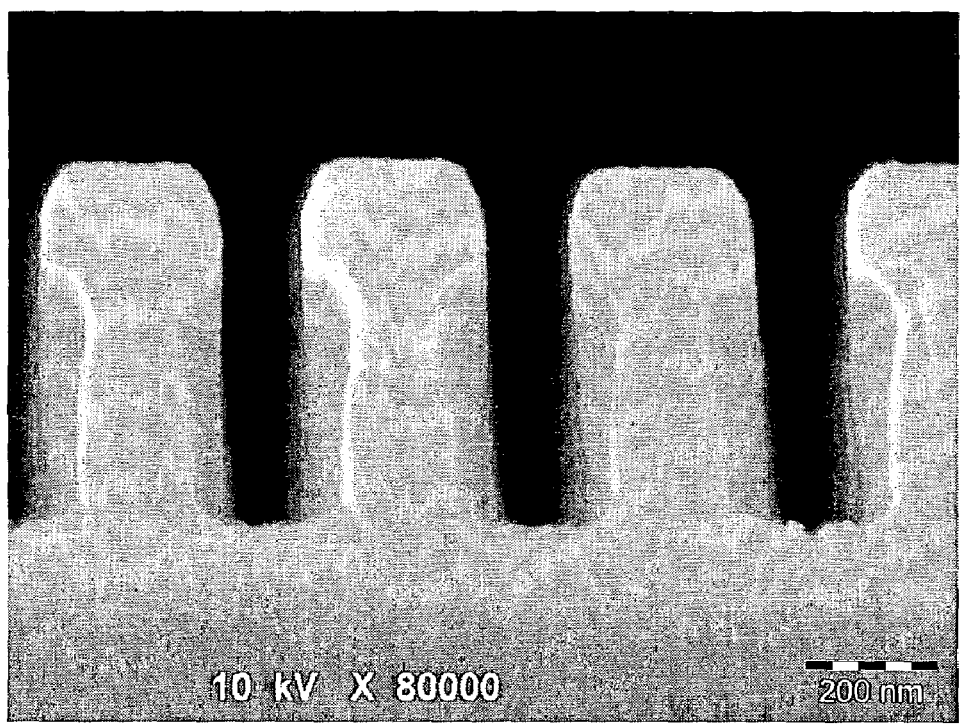

FIG. 4a shows the SEM image of the sample with protective layer on top, sidewall, and bottom of the trenches. No damage is seen. FIG. 4b shows the SEM image of the sample with protective layer on top, but without protective layer on sidewall and bottom of the trenches. Damage (etching) is seen on the sidewall and bottom, no damage is seen on the top.

What is claimed is:

1. A method to protect an organic polymer dielectric underlayer during a plasma assisted process from damage to the dielectric in the form of physical etching by plasma excited species, the method comprising:
   providing an organic polymer dielectric underlayer, the organic polymer dielectric underlayer being susceptible to be etched by plasma excited species;
   depositing a protective continuous layer of inorganic material directly on the organic polymer dielectric underlayer using a first plasma power plasma assisted process, a first plasma power of the first plasma power plasma assisted process being selected in order to avoid damaging the organic polymer dielectric underlayer and the protective continuous layer to function as a protective layer during subsequent steps; and
   depositing a second plasma power plasma assisted fun onto the protective layer, a second plasma power for depositing the second plasma power plasma assisted film being higher than the first plasma power, whereby the protective layer protects the organic polymer dielectric underlayer from being damaged by the plasma excited species,
   whereby the organic polymer dielectric is protected from damage due to physical etching by plasma excited species.

2. A method as in claim 1 wherein the first plasma power is between 100 W to 500 W.

3. A method as in claim 1 wherein the second plasma power is between 600 W to 3000 W.

4. A method as in claim 1 wherein the organic polymer dielectric material is selected from a group consisting of polytetrafluoroethylene (PTFE), parylene, benzocyclobutene-based polymers (BCB), polyimide, poly(arylene ether)-based polymers (PAE), and cyclohexanone-based polymers.

5. A method as in claim 1 wherein the inorganic material is selected from a group consisting of silicon-based materials, and metal based materials.

6. A method as in claim 1 wherein the thickness of the protective layer is between 1 monolayer and 10 monolayers.

7. A method as in claim 1 wherein the deposition process employs a metal organic precursor to deposit a metal-based film.

8. A method as in claim 7 wherein the metal organic precursor is TDMAT (tetrakis dimethyl amino titanium) to form a nitrided titanium film.

9. A method as in claim 1 wherein the deposition process employs TEOS (tetra ethyl ortho silicate) to form a silicon oxide film.

10. A method as in claim 1 wherein the deposition process is selected from a group consisting of PECVD (plasma enhanced chemical vapor deposition), PEALD (plasma enhanced atomic layer deposition), and PENLD (plasma enhanced nanolayer deposition) using plasma energy to excite the precursors.

11. A method as in claim 1 wherein the deposition process is a cyclic process using a sequence of metal organic precursor deposition and nitrogen-containing plasma treatment to form a nitrided metal film.

12. A method as in claim 1 wherein the deposition process is a cyclic process using a sequence of TDMAT precursor deposition and nitrogen plasma treatment to form a titanium nitride film.

13. A method as in claim 1 wherein the deposition process is a cyclic process using a sequence of TEOS precursor deposition and nitrogen or oxygen plasma treatment to form a silicon oxide film.

14. A method as in claim 1 wherein the deposition process is a PECVD process using TDMAT precursor to form a titanium nitride film.

15. A method as in claim 1 wherein the deposition process is a PECVD process using TEOS precursor to form a silicon oxide film.

16. A method as in claim 1 wherein the first power plasma assisted process and the second power plasma assisted process employ the same precursors.

17. A method as in claim 1 wherein the first power plasma assisted process and the second power plasma assisted process employ different precursors.

* * * * *

UNITED STATES PATENT AND TRADEMARK OFFICE
CERTIFICATE OF CORRECTION

| | | |
|---|---|---|
| PATENT NO. | : 7,163,721 B2 | Page 1 of 1 |
| APPLICATION NO. | : 10/360134 | |
| DATED | : January 16, 2007 | |
| INVENTOR(S) | : Zhihong Zhang et al. | |

It is certified that error appears in the above-identified patent and that said Letters Patent is hereby corrected as shown below:

Column 7, line 59: After "plasma assisted", delete "fun" and insert --film--.

Signed and Sealed this

Seventh Day of August, 2007

JON W. DUDAS
*Director of the United States Patent and Trademark Office*